United States Patent [19]
Uchida et al.

[11] Patent Number: 5,293,515
[45] Date of Patent: Mar. 8, 1994

[54] AMPLIFIER CIRCUIT HAVING TWO INVERTERS

[75] Inventors: Masanori Uchida, Kanagawa; Tetsuya Iizuka, Chiba, both of Japan

[73] Assignee: Kabushiki Kaisha Toshiba, Kanagawa, Japan

[21] Appl. No.: 981,521

[22] Filed: Nov. 25, 1992

Related U.S. Application Data

[63] Continuation of Ser. No. 521,977, Aug. 24, 1990, abandoned.

[30] Foreign Application Priority Data

Sep. 12, 1989 [JP] Japan .................................. 1-234657

[51] Int. Cl.⁵ .................... H03K 19/094; H03K 3/26
[52] U.S. Cl. .................................... 307/530; 307/451; 307/279; 307/272.1
[58] Field of Search ............... 307/443, 448, 451, 530, 307/279, 272.1, 263-264

[56] References Cited

U.S. PATENT DOCUMENTS

| | | | |
|---|---|---|---|
| 4,616,148 | 10/1986 | Ochii et al. ........................ | 307/530 |
| 4,843,264 | 6/1989 | Galbraith ........................... | 307/530 |
| 4,910,713 | 3/1990 | Madden et al. ..................... | 365/189 |
| 4,937,476 | 1/1990 | Bazes .................................. | 307/475 |

FOREIGN PATENT DOCUMENTS

| | | |
|---|---|---|
| 0143591A2 | 6/1985 | European Pat. Off. . |
| 57-150185 | 9/1982 | Japan . |
| 59-207084 | 11/1984 | Japan . |
| WO88/09034 | 11/1988 | PCT Int'l Appl. . |

OTHER PUBLICATIONS

"Low-power Data Register," Chin et al., IBM Tech. Disc. Bul., vol. 15, No. 12, May 1973.

*Primary Examiner*—Margaret R. Wambach
*Attorney, Agent, or Firm*—Finnegan, Henderson, Farabow, Garrett & Dunner

[57] ABSTRACT

An amplifier circuit includes two inverter circuits. Each inverter circuit provides an output signal in response to a respective input signal. The inverter circuits are supplied with a power source voltage through a MOS transistor circuit. The MOS transistor circuit includes two MOS transistors each having gate electrodes supplied with the output of the inverter circuits.

3 Claims, 6 Drawing Sheets

AMPLIFIER CIRCUIT HAVING TWO INVERTERS

This is a continuation of application Ser. No. 07/571,977, filed Aug. 24, 1990 now abandoned.

BACKGROUND OF THE INVENTION

1. Field of the Invention

This invention concerns an amplifier circuit which is suitable for use as a sense amplifier in a semiconductor memory device.

2. Description of Related Art

Conventionally, amplifier circuits are used as sense amplifiers in semiconductor memory devices. The number of sense amplifiers used increases in proportion to increased integration, especially in DRAM device. Thus, a sense amplifier with low power consumption and which is composed of limited circuit elements is required. To reduce the power consumption and the number of circuit elements used, the inventors attempted to modify the amplifier circuit shown in FIG. 1.

Figure 1:
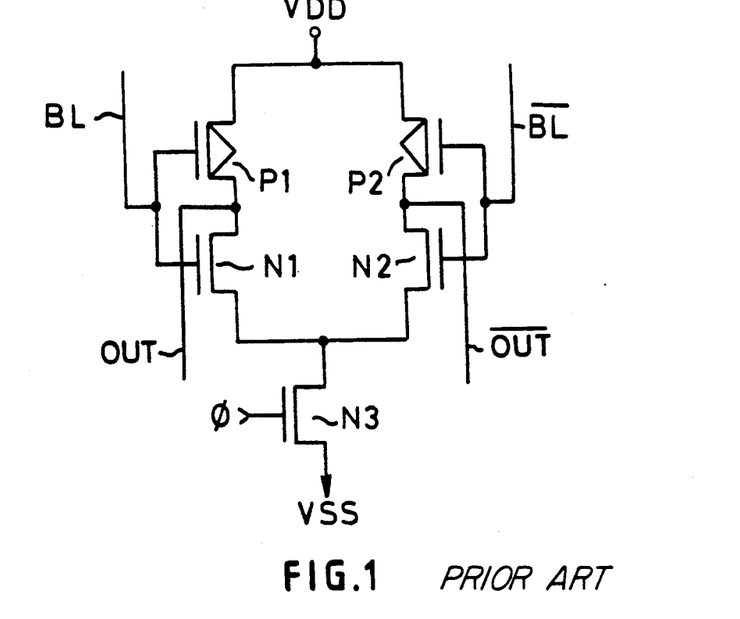
FIG. 1 is a circuit diagram of an amplifier circuit developed by the inventors.

In FIG. 1, P1 and P2 represent P-type MOS transistors and N1 to N3 represent N-type MOS transistors. In this sense amplifier, output signals OUT and $\overline{OUT}$ are obtained by amplifying the difference in voltage between the bit lines BL and $\overline{BL}$ when the MOS transistor N3 is activated in response to an enable signal $\Phi$. Since the output signals OUT and $\overline{OUT}$ are achieved by the switching operation of the inverters composed of CMOS circuits, a reduction in the power consumption is achieved. However, in this amplifier circuit, the sensing margin is insufficient, as will be explained in detail below.

Figure 2:
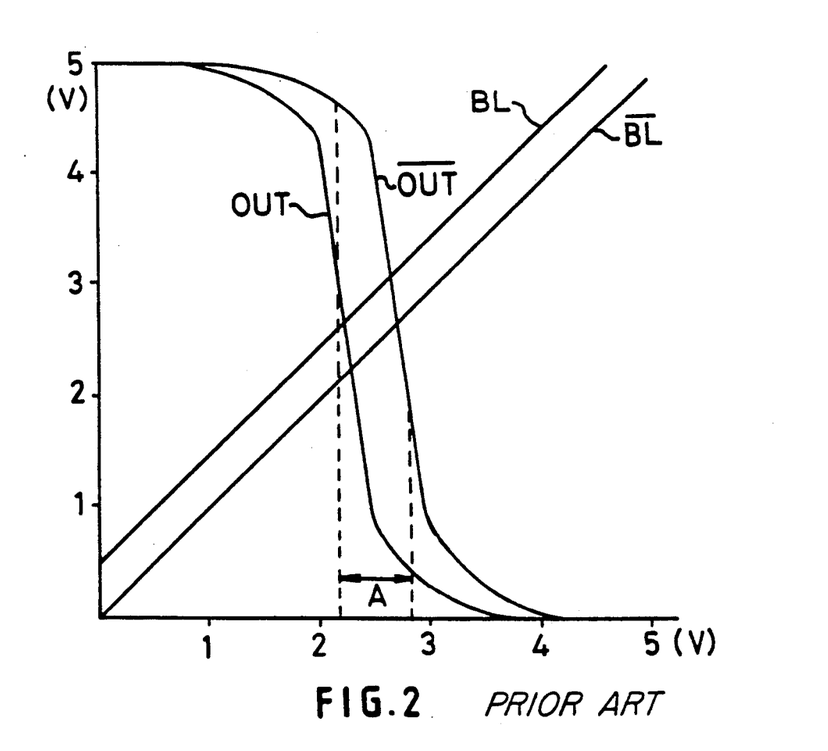
FIG. 2 is a characteristic curve of the circuit shown in FIG. 1.

FIG. 2 shows a characteristic curve of the amplifier circuit shown in FIG. 1 where the VDD is 5 volts and VSS is ground level. In FIG. 2, the X-axis represents the input voltage and the Y-axis represents the output voltage. BL and $\overline{BL}$ represent input signals to the amplifier circuit.

The output signals OUT and $\overline{OUT}$ are achieved as the inverted signals of the input signals BL and $\overline{BL}$, when the voltage of the respective input signals exceed the predetermined threshold voltages of the inverter circuits. If the sensing area is defined by an area wherein the amplification factor is more than 3, the sensing area of the circuit shown in FIG. 1 is illustrated by A. Namely, the sensing area is narrow. Thus, the circuit shown in FIG. 1 is insufficient as a sense amplifier in a memory device, the sensing margin being too small with respect to the fluctuation of the input signals.

SUMMARY OF THE INVENTION

Therefore, an object of the present invention is to provide an amplifier circuit which has a wide operation area and low power consumption.

Another object of the present invention is to provide an amplifier circuit which is suitable for a sense amplifier in a memory device.

To achieve the objects, this invention provides an amplifier circuit comprising: first inverter circuit means responsive to a first power source voltage and a second power source voltage, for outputting a first output signal in response to a first input signal; second inverter circuit means responsive to the first power source voltage and the second power source voltage, for outputting a second output signal in response to a second input signal; first circuit means for supplying the first power source voltage to the first and the second inverter circuit means, including a first MOS transistor of a first conductivity type having a gate electrode supplied with the output signal of the first inverter circuit means and a second MOS transistor of the first conductivity type having a gate electrode supplied with the output signal of the second inverter circuit means; and second circuit means for supplying the second power source voltage to the first and the second inverter circuit means.

BRIEF DESCRIPTION OF THE DRAWINGS

The accompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. In the drawings.

DETAILED DESCRIPTION OF THE INVENTION

Figure 3:
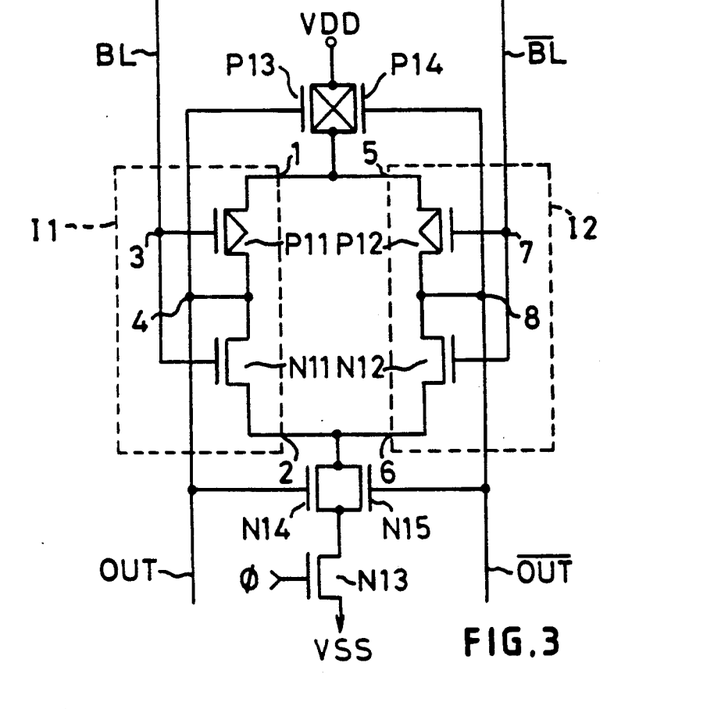
FIG. 3 is a circuit diagram of a first embodiment of the present invention.

Referring now to the drawings, the present invention will be explained. FIG. 3 is a circuit diagram of a first embodiment of the present invention. In the following explanation, the word "terminal" is used for convenience of explanation. However, the "terminal" may be just a wiring layer. In this embodiment of the present invention, there is provided a first inverter circuit I1.

The first inverter I1 includes a first power source terminal 1, a second power source terminal 2, a first input terminal 3 and a first output terminal 4. The first input terminal 3 is connected to a bit line BL of a DRAM device (not shown), in this embodiment.

The first inverter circuit I1 includes an N-type MOS transistor N11 and a P-type MOS transistor P11. The source electrode of the N-type MOS transistor N11 is connected to the second power source terminal 2 and the gate electrode thereof is connected to the first input terminal 3. The source electrode of the P-type MOS transistor P11 is connected to the first power source terminal 1, and the gate electrode of the P-type MOS transistor P11 is connected to the first input terminal 3. The drain electrodes of the transistors N11 and P11 are connected in common and are connected to the first output terminal 4.

The second inverter circuit I2 includes a third power source terminal 5, a fourth power source terminal 6, a second input terminal 7 and a second output terminal 8. The second inverter circuit I2 includes a P-type MOS transistor P12 and an N-type MOS transistor N12. The source electrode of the transistor N12 is connected to the fourth power source terminal 4. The source electrode of the transistor P12 is connected to the third power source terminal 5. The gate electrodes of the transistors N12 and P12 are connected to the second input terminal 7, and the drain electrodes thereof are connected in common and to the second output terminal 8.

This embodiment further comprises two N-type MOS transistors N14 and N15. The drain electrodes of the transistors N14 and N15 are connected in common and to the second and the fourth power source terminals 2 and 6. The gate electrode of the transistor N14 is supplied with the output of the first inverter circuit I1, and the gate electrode of the transistor N15 is supplied with the output of the second inverter circuit I2.

The source electrodes of the transistors N14 and N15 are connected in common and are supplied with the power source voltage Vss through an N-type MOS transistor N13 which is controlled by a switching signal Φ.

This embodiment further includes two P-type MOS transistors P13 and P14. The drain electrodes of the transistors P13 and P14 are connected in common and to the first and the third power source terminals 1 and 5. The source electrodes of the transistors P13 and P14 are connected in common and are supplied with the power source voltage VDD. The gate electrode of the transistor P13 is supplied with the output of the first inverter circuit I1, and the gate electrode of the transistor P14 is supplied with the output of the second inverter circuit I2.

In this circuit, when the voltage level of the bit line BL is high and the voltage level of the bit line $\overline{BL}$ is low, the output level of OUT becomes low and that of $\overline{OUT}$ becomes high. Thus, the gate voltage of the transistor N14 is lowered and the conductivity thereof is lowered. Therefore, the source potential of the transistor N11 is raised and the conductivity thereof is lowered. Namely, due to the N-type MOS transistor N14, a negative feedback loop is formed between the first inverter circuit I1 and the transistor N14. In other words, the transistor N14 operates to bring the threshold voltage of the first inverter circuit I1 closer to the input voltage of the bit line BL.

In the same way, the transistor N15 operates to bring the threshold voltage of the second inverter circuit I2 closer to the input voltage of the bit line $\overline{BL}$.

On the other hand, when the voltage level of the bit line BL becomes low, the output OUT becomes high level. Thus, the conductivity of the P-type MOS transistor P13 is lowered and the source voltage of the transistor P11 is also lowered. Thus, the conductivity of the transistor P11 is lowered and the potential of the output OUT is also lowered. Namely, the P-type MOS transistor P13 functions to form a negative feedback loop with the first inverter circuit I1 with respect to the rise of the voltage level of OUT.

Similarly, the transistor P14 forms a negative feedback loop with the second inverter I2 with respect to the rise of the voltage level $\overline{OUT}$.

Figure 4:
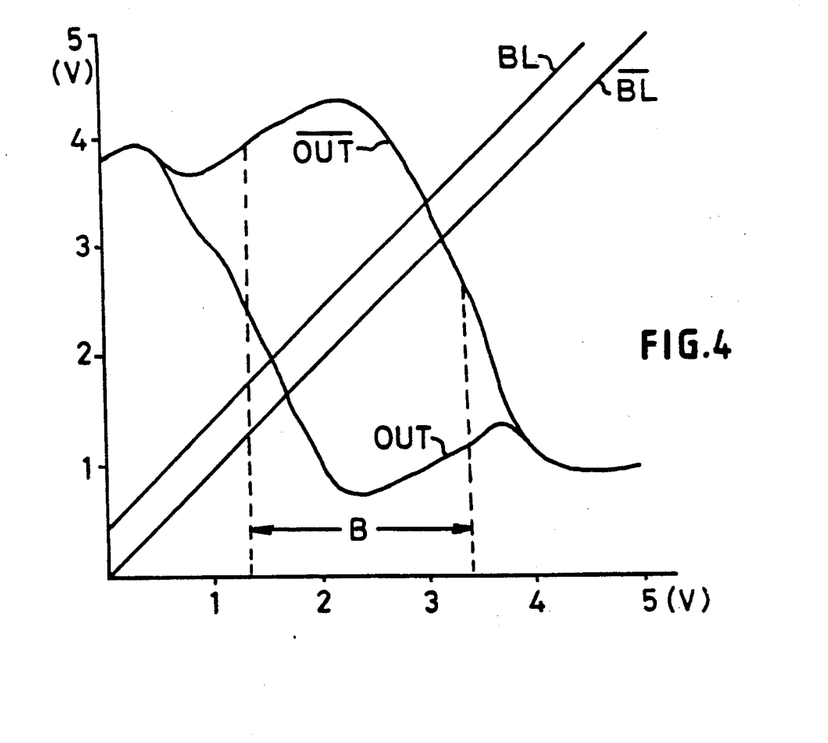
FIG. 4 is a characteristic curve of the circuit shown in FIG. 3.

FIG. 4 shows the characteristic curve of the circuit shown in FIG. 3 in the condition wherein VDD is 5.0 volts and the VSS is grounded. As shown in FIG. 4, the sensing area (illustrated by B) is significantly expanded compared with that of the circuit of FIG. 1. Namely, the amplifier circuit of FIG. 3 can sense the input voltage in the range between about 1.2 volts to 3.4 volts. Thus, the sensing margin is significantly increased.

Furthermore, since the inverters I1 and I2 are composed of CMOS circuits, the power consumption is significantly reduced.

Still furthermore, the circuit construction is symmetrical. Thus, the sensing is performed in a balanced condition.

Figure 5:
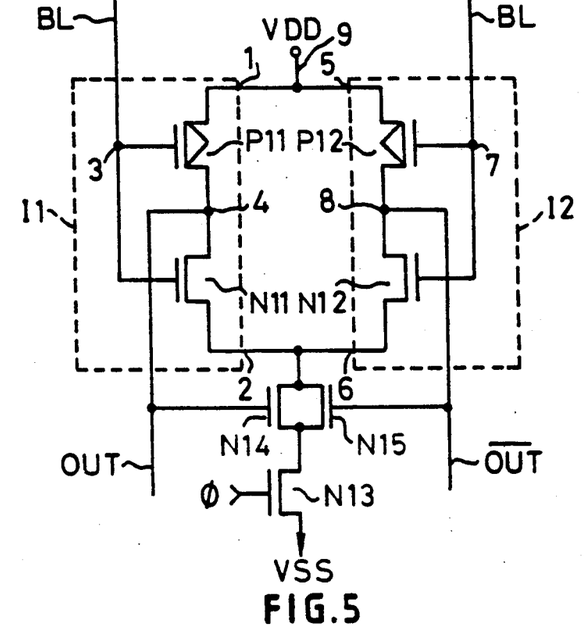
FIG. 5 is a circuit diagram of a second embodiment of the present invention.

FIG. 5 is a circuit diagram of a second embodiment of the present invention. In this embodiment, the two P-type MOS transistors P13 and P14 in the first embodiment shown in FIG. 3 are omitted, and the power source voltage VDD is applied to the inverter circuits I1 and I2 through a wiring In this embodiment, a negative feedback loop with respect to the fall of the output voltage level is also formed. Thus, the sensing area is expanded and the sensing margin is increased.

Figure 6:
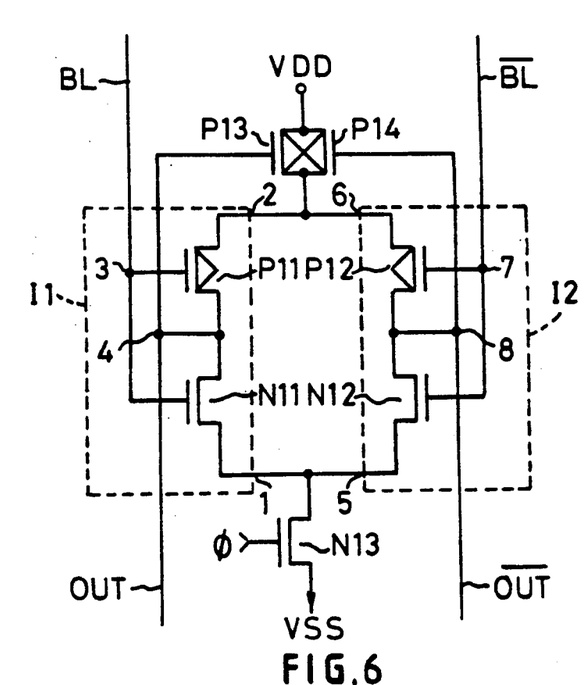
FIG. 6 is a circuit diagram of a third embodiment of the present invention.

FIG. 6 is a circuit diagram of a third embodiment of the present invention. In this embodiment, the two N-type MOS transistors N14 and N15 in the first embodiment shown in FIG. 3 are omitted, and the power source voltage Vss is applied to the inverter circuits I1 and I2 through the MOS transistor N13. In this embodiment, a negative feedback loop with respect to the rise of the output level is formed to expand the sensing area.

Figure 7:
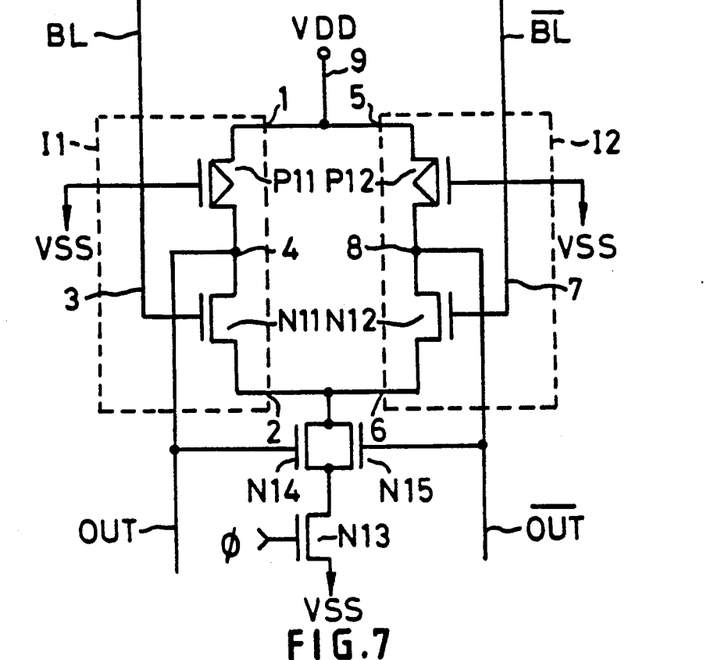
FIG. 7 is a circuit diagram of a fourth embodiment of the present invention.

FIG. 7 is a circuit diagram of a fourth embodiment of the present invention. In this embodiment, the inverter circuit I1 includes an N-type MOS transistor N11 and a P-type MOS transistor P11 of the normally-ON type. Namely, the gate electrode of the P-type MOS transistor P11 is supplied with a low level power source voltage VSS. Similarly, the second inverter I2 includes an N-type MOS transistor N12 and a normally-ON type transistor P12.

In this embodiments, the gate electrodes of only the N-type MOS transistors N11 and N12 are connected to the bit lines BL and $\overline{BL}$. Thus, the capacitance due to the gate electrodes of the P-type MOS transistors P11 and P12 is eliminated and the circuit is suitable for high speed sensing.

Figure 8:
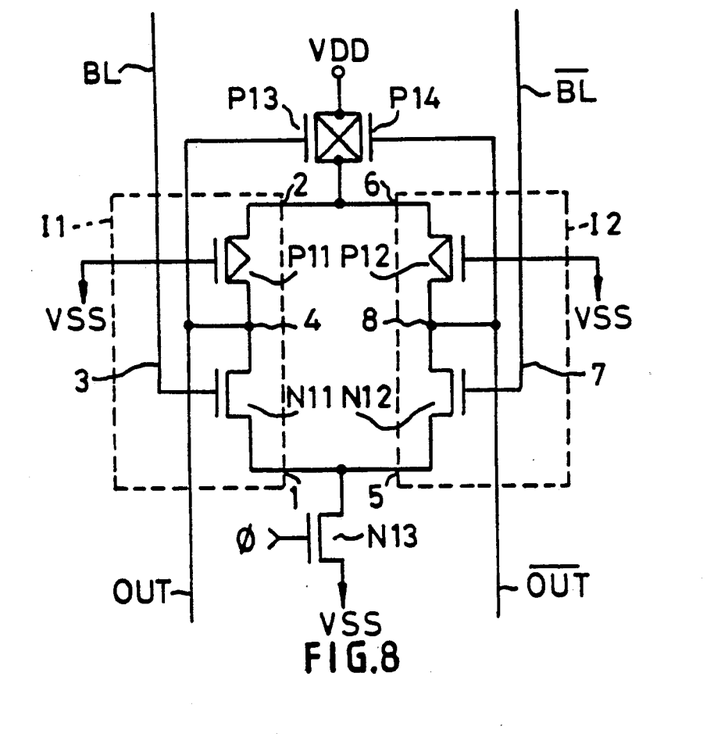
FIG. 8 is a circuit diagram of a fifth embodiment of the present invention.

FIG. 8 is a circuit diagram of a fifth embodiment of the present invention. In this embodiment, the inverter circuits I1 and I2 of the third embodiment shown in FIG. 6 are replaced by inverter circuits which include an N-type MOS transistor and a normally-ON type MOS transistor.

Figure 9:
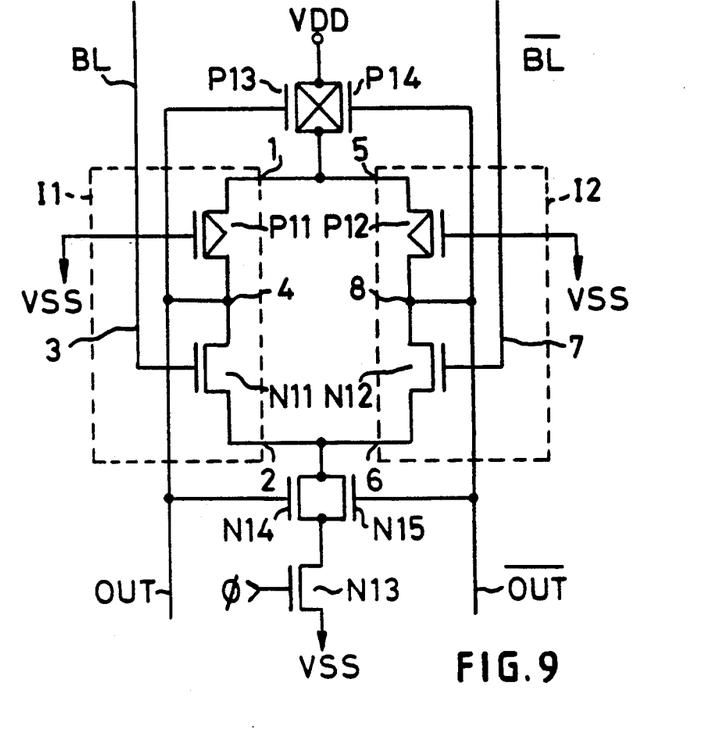
FIG. 9 is a circuit diagram of a sixth embodiment of the present invention.

FIG. 9 is a circuit diagram of a sixth embodiment of the present invention. In this embodiment, the inverter circuit of the first embodiment shown in FIG. 3 is replaced by an inverter circuit which includes an N-type MOS transistor and a normally-ON type MOS transistor.

Figure 10:
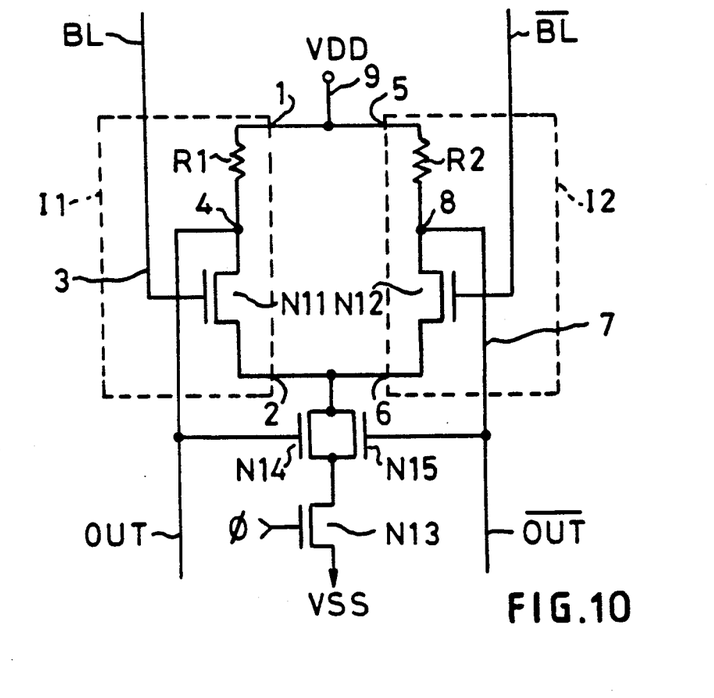
FIG. 10 is a circuit diagram of a seventh embodiment of the present invention.

FIG. 10 is a circuit diagram of a seventh embodiment of the present invention. In this embodiment, the inverter circuits of the second embodiment shown in FIG. 5 are replaced by a inverter circuit which includes an N-type MOS transistor N11 and N12 and a resistor $R_1$ and $R_2$.

Namely, the first inverter circuit I1 includes an N-type MOS transistor N11 and a resistor R1. The gate electrode of transistor N11 is connected to the input terminal 3 and is supplied with the input signal. One end of the resistor R1 is supplied with the power source voltage VDD through a wiring 9, and the other end is connected to the drain electrode of the transistor N11. The connection of the resistor R1 and the drain electrode of the transistor N11 form the output terminal 4. Similarly, the inverter circuit I2 includes a resistor R2 and a MOS transistor N12.

Figure 11:
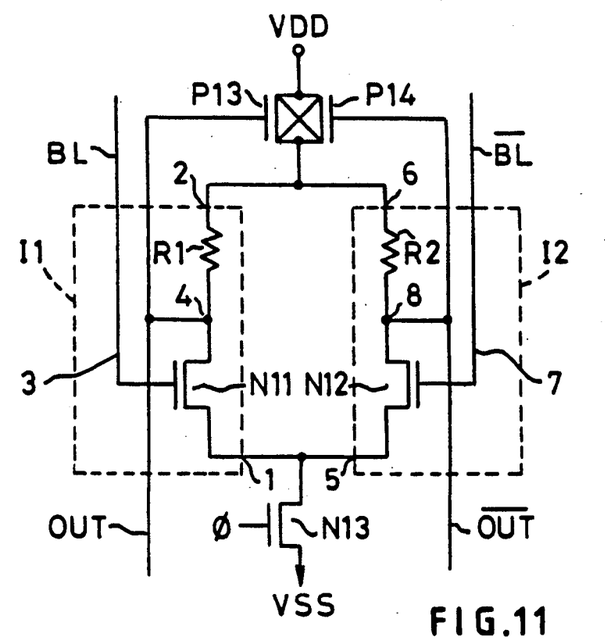
FIG. 11 is a circuit diagram of a eighth embodiment of the present invention.

FIG. 11 is a circuit diagram of a eighth embodiment of the present invention. In this embodiment, as in the seventh embodiment explained above, the inverter circuits in the third embodiment shown in FIG. 6 are replaced by an inverter circuit which includes an N-type MOS transistor $N_{11}$ and $N_{12}$ and a resistor $R_1$ and $R_2$.

Figure 12:
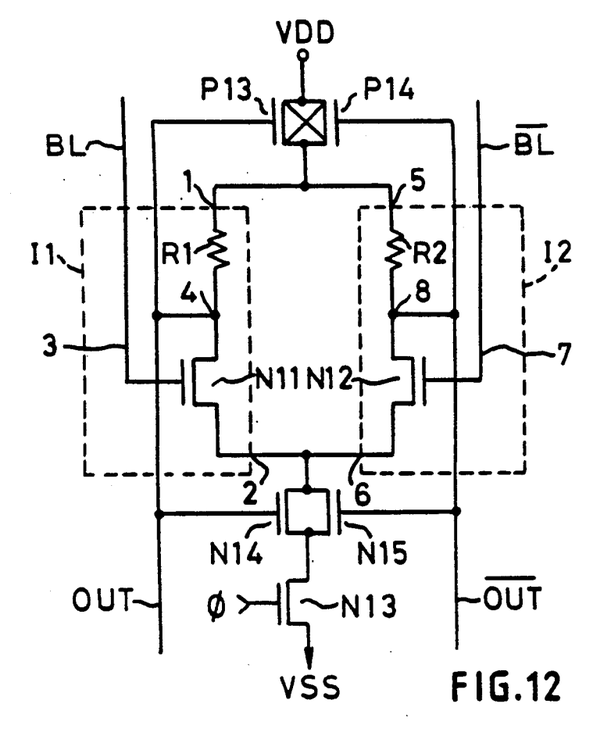
FIG. 12 is a circuit diagram of a ninth embodiment of the present invention.

FIG. 12 is a circuit diagram of a ninth embodiment of the present invention. In this embodiment, as in the seventh embodiment, the inverter circuit of the first embodiment shown in FIG. 3 is also replaced by an inverter which includes an N-type MOS transistor and a resistor.

The present invention has been described with respect to specific embodiments. However, other embodiments based on the principles of the present invention should be obvious to those of ordinary skill in the art. Such embodiments are intended to be covered by the claims.

What is claimed is:

1. An amplifier circuit comprising:
first inverter circuit means responsive to a first power source voltage and a second power source voltage, wherein the first power source voltage is lower than the second power source voltage, for outputting a first output signal in response to a first input signal, wherein the first inverter circuit means includes:
   a first MOS transistor of a first conductivity type having a source electrode supplied with the first power source voltage, a drain electrode, and a gate electrode supplied with the first input signal, and
   a second MOS transistor of a second conductivity type having a source electrode supplied with the second power source voltage, a drain electrode connected to the drain electrode of the first MOS transistor, and a gate electrode supplied with the first input signal;
second inverter circuit means responsive to the first power source voltage and the second power source voltage, for outputting a second output signal in response to a second input signal, wherein the second inverter circuit means includes:
   a third MOS transistor of the first conductivity type, having a source electrode supplied with the first power source voltage, a drain electrode, and a gate electrode supplied with the second input signal, a fourth MOS transistor of the second conductivity type having a source electrode supplied with the second power source voltage, a drain electrode connected to the drain electrode of the third MOS transistor, and a gate electrode supplied with the second input signal;
first circuit means for supplying the first power source voltage to the first and the second inverter circuit means, including a fifth MOS transistor of the first conductivity type having a gate electrode supplied with the output signal of the first inverter circuit means and a sixth MOS transistor of the first conductivity type having a gate electrode supplied with the output signal of the second inverter circuit means, wherein the fifth and the sixth MOS transistors are N-type MOS transistors; and
second circuit means for supplying the second power source voltage to the first and the second inverter circuit means.

2. An amplifier circuit comprising:
first inverter circuit means responsive to a first power source voltage and a second power source voltage, wherein the first power source voltage is higher than the second power source voltage, for outputting a first output signal in response to a first input signal, wherein the first inverter circuit means includes:
   a first MOS transistor of a first conductivity type having a source electrode supplied with the first power source voltage, a drain electrode, and a gate electrode supplied with the first input signal,
   a second MOS transistor of a second conductivity type having a source electrode supplied with the second power source voltage, a drain electrode connected to the drain electrode of the first MOS transistor, and a gate electrode supplied with the first input signal;
second inverter circuit means responsive to the first power source voltage and the second power source voltage, for outputting a second output signal in response to a second input signal, wherein the second inverter circuit means includes:
   a third MOS transistor of the first conductivity type, having a source electrode supplied with the first power source voltage, a drain electrode, and a gate electrode supplied with the second input signal, a fourth MOS transistor of the second conductivity type having a source electrode supplied with the second power source voltage, a drain electrode connected to the drain electrode of the third MOS transistor, and a gate electrode supplied with the second input signal;
first circuit means for supplying the first power source voltage to the first and the second inverter circuit means, including a fifth MOS transistor of the first conductivity type having a gate electrode supplied with the output signal of the first inverter circuit means and a sixth MOS transistor of the first conductivity type having a gate electrode supplied with the output signal of the second inverter circuit means, wherein the fifth and the sixth MOS transistors are P-type MOS transistors; and
second circuit means for supplying the second power source voltage to the first and the second inverter circuit means.

3. An amplifier circuit comprising:
first inverter circuit means responsive to a first power source voltage and a second power source voltage, for outputting a first output signal in response to a first input signal, wherein the first inverter circuit means includes:
   a first MOS transistor of a first conductivity type having a source electrode supplied with the first power source voltage, a drain electrode, and a gate electrode supplied with the first input signal, and
   a second MOS transistor of a second conductivity type having a source electrodes supplied with the second power source voltage, a drain electrode connected to the drain electrode of the first MOS transistor, and a gate electrode supplied with the first input signal;

second inverter circuit means responsive to the first power source voltage and the second power source voltage, for outputting a second output signal in response to a second input signal, wherein the second inverter circuit means includes:
- a third MOS transistor of the first conductivity type having a source electrode supplied with the first power source voltage, a drain electrode, and a gate electrode supplied with the second input signal, and
- a fourth MOS transistor of the second conductivity type having a source electrode supplied with the second power source voltage, a drain electrode connected to the drain electrode of the third MOS transistor, and a gate electrode supplied with the second input signal;

first circuit means for supplying the first power source voltage to the first and the second inverter circuit means, including a fifth MOS transistor of the first conductivity type having a gate electrode supplied with the output of the first inverter circuit means, and a sixth MOS transistor of the first conductivity type having a gate electrode supplied with the output of the second inverter circuit means; and second circuit means for supplying the second power source voltage to the first and the second inverter circuit means, including a seventh MOS transistor of the second conductivity type having a gate electrode supplied with the output of the first inverter circuit means, and an eighth MOS transistor of the second conductivity type having a gate electrode supplied with the output of the second inverter circuit means.

* * * * *

UNITED STATES PATENT AND TRADEMARK OFFICE
CERTIFICATE OF CORRECTION

PATENT NO. : 5,293,515
DATED : March 8, 1994
INVENTOR(S) : Masanori Uchida

It is certified that error appears in the above-indentified patent and that said Letters Patent is hereby corrected as shown below:

On title page, item [63] U.S. Application Data, change "521,977" to --571,977--.

Claim 3, column 6, line 66, change "electrodes" to --electrode--.

Signed and Sealed this

Twenty-ninth Day of November, 1994

Attest:

BRUCE LEHMAN

Attesting Officer     Commissioner of Patents and Trademarks